United States Patent
Patel et al.

(10) Patent No.: US 6,243,304 B1
(45) Date of Patent: Jun. 5, 2001

(54) SAMPLE AND LOAD SCHEME FOR OBSERVABILITY INTERNAL NODES IN A PLD

(75) Inventors: Rakesh H. Patel, Cupertino; Kevin A. Norman, Belmont, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/441,143

(22) Filed: Nov. 12, 1999

Related U.S. Application Data

(62) Division of application No. 09/012,667, filed on Jan. 23, 1998, now Pat. No. 6,014,334, and a division of application No. 08/615,342, filed on Mar. 11, 1996, now Pat. No. 5,764,079.

(51) Int. Cl.[7] ................................................. G11C 7/00
(52) U.S. Cl. ........................................ 365/189.08; 326/40
(58) Field of Search .................... 365/189.08; 326/40, 326/37, 41

(56) References Cited

U.S. PATENT DOCUMENTS

| | | | |
|---|---|---|---|
| 4,864,579 | 9/1989 | Kishida et al. | 371/22.3 |
| 5,497,475 | 3/1996 | Alapat | 395/430 |
| 5,568,380 | * 10/1996 | Brodnax et al. | 364/184 |
| 5,581,198 | 12/1996 | Trimberger | 326/38 |
| 5,764,079 | * 6/1998 | Patel et al. | 326/40 |
| 5,870,410 | 2/1999 | Norman et al. | 371/22.2 |
| 6,014,334 | * 1/2000 | Patel et al. | 365/189.08 |

* cited by examiner

Primary Examiner—David Nelms
Assistant Examiner—M. Tran
(74) Attorney, Agent, or Firm—Townsend and Townsend and Crew

(57) ABSTRACT

A programmable logic device (PLD) that provides the capability to observe and control the logic state of buried internal nodes is disclosed. The PLD provides shadow storage units for internal nodes such as logic element registers, memory cells, and I/O registers. A sample/load data path includes bidirectional data buses and shift register that facilitate the sampling of internal nodes for observing their logic states, and loading of internal nodes for controlling their logic states.

6 Claims, 6 Drawing Sheets

SAMPLE AND LOAD SCHEME FOR OBSERVABILITY INTERNAL NODES IN A PLD

This application is Div of Ser. No. 09/012,667 filed Jan. 23, 1998, U.S. Pat. No. 6,014,334, and a div of application Ser. No. 08/615,342 filed Mar. 11, 1996, U.S. Pat. No. 5,764,079.

RELATED APPLICATIONS

The present invention is related to commonly assigned, U.S. Pat. No. 6,020,758, entitled "Partially Reconfigurable Programmable Logic Device," by Patel et al., which is hereby incorporated by reference in its entirety for all purposes.

BACKGROUND OF THE INVENTION

The present invention relates in general to programmable logic circuits, and in particular to a circuit and methodology that allow the user to observe the state of internal nodes within the programmable logic circuit.

A growing trend in the field of electronic circuits and systems design is the use of prototyping or emulation systems that are built with programmable logic devices (PLDs). Such emulation systems help in debugging complex designs with quick turn-around which ensure successful time-to-market for the final product. Programmable logic devices, including programmable logic arrays (PLAs) and field programmable gate arrays (FPGAs) are particularly suited for such debug systems since they provide the flexibility required by design adjustments resulting from design errors or enhancements. Furthermore, such hardware prototyping solutions are often fast enough to operate in the context of the rest of the system. This gives the system designers a high degree of confidence.

A drawback of existing PLD-based emulation or prototyping systems, however, is that the internal state of the programmable logic devices are inaccessible and buried inside the device. This limits the troubleshooting and debugging capabilities of the system. Software based emulation systems provide for complete observability of all nodes within the system, but at the cost of running from 100 to 1 million times slower than the rest of the system.

There is therefore a need for programmable logic devices that can operate at full system speed while simultaneously providing access to observe the state of internal nodes of the device.

SUMMARY OF THE INVENTION

The present invention provides various embodiments for a programmable logic device (PLD) that allows complete observability of the states of internal nodes. Among the various internal nodes, the PLD of this invention provides observability and controllability of, for example, the state of a flip-flop inside each logic element, the state of memory bits, as well as the state of input/output (I/O) pins.

Accordingly, in one embodiment, the present invention provides a programmable logic device including a plurality of logic array blocks each having a plurality of logic elements, and a network of interconnect lines interconnecting the plurality of logic array blocks. Each logic element includes a primary register coupled to a shadow storage unit. Data buses couple a shift register to the plurality of logic array blocks. The shift register also couples to an I/O pin. In a sample mode of operation, the contents of selected primary registers are sampled into the corresponding shadow storage units, and made available on the I/O pin via the shift register. In a load mode of operation, the contents of selected shadow storage units are loaded into the corresponding primary registers.

In another embodiment, the PLD further includes memory blocks having random access memory cells. The memory cells within the memory block are made observable by a similar arrangement whereby each memory cell is provided with and coupled to a shadow storage unit.

In yet another embodiment, I/O cells around the periphery of the PLD are provided with dedicated shadow storage units as well. In a specific embodiment of the present invention, the JTAG boundary scan chain of latches are used as the shadow storage units to provide observability of the I/O cells.

A better understanding of the nature and advantages of the PLD of the present invention may be gained by reference to the detailed description and diagrams below.

DESCRIPTION OF SPECIFIC EMBODIMENTS

Figure 1:
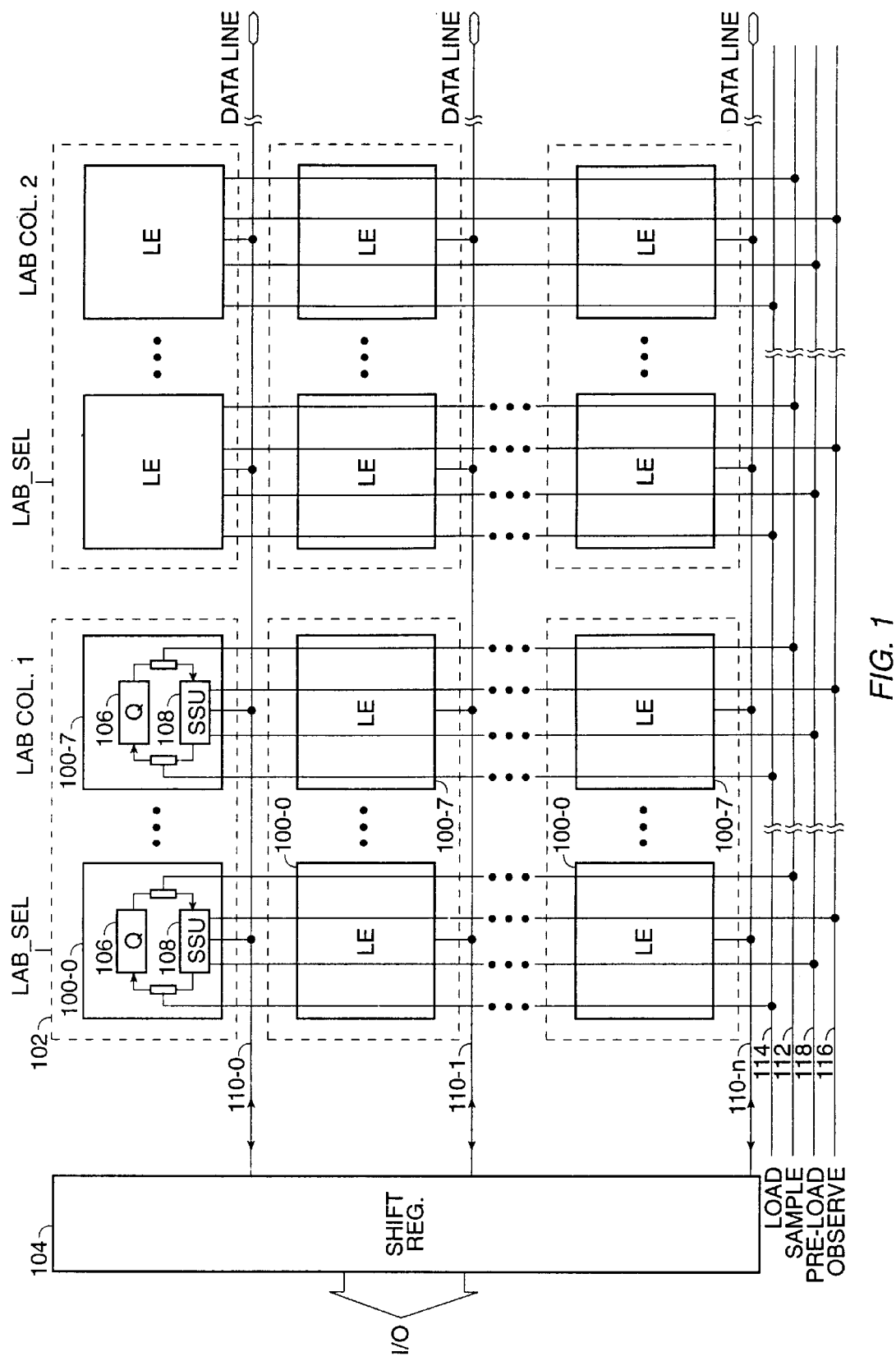
FIG. 1 is a simplified block diagram showing a portion of a PLD with observable logic element registers.

Referring to FIG. 1, there is shown a portion of a PLD having logic elements whose states are observable. A number, for example eight, of logic elements 100 are grouped together to form a logic array block or LAB 102. LABs 102 are then grouped together in two or more stacks or columns 103 coupled together by an interconnect array. FIG. 1 shows two columns of LABs and a shift register 104. A column of LABs 102 receives a LAB_SEL line that activates that particular LAB column when asserted.

Each logic element 100 includes a primary register Q 106 coupled to a shadow storage unit SSU 108. Shadow storage units 108 in the logic elements in a row connect to a bidirectional data line 110. Each row of logic elements 100 thus has a dedicated bidirectional data line 110. Data lines 110 connect to the shift register 104. Given n data lines per column of LABs, shift register 104 would be an n-bit long shift register.

Depending on the PLD programming architecture, data lines 110 either need to be added or can share already existing programming data lines. For example, in those PLDs that provide for address wide access to the LABs, dedicated data lines are already provided for programming and can thus be utilized in the sample/observe mode as well. In those PLDs whose programming is based on a first-in first-out (FIFO) architecture, however, dedicated data lines are not provided and thus data lines 110 must be added for observability. The two different exemplary programming architectures are described in greater detail in the above-referenced related co-pending, commonly-assigned patent application Ser. No. 08/615,341.

A sample line 112, load line 114, observe line 116, and pre-load line 118 connect to all logic elements 100 in each LAB 102. When a transition (e.g. rising edge) occurs for the signal on the sample line 112, the contents of primary registers Q 106 in the logic elements 100 in the selected LAB 102 are sampled into their respective SSUs 108. This data is then transferred to the respective bidirectional data line 110 in response to a signal on the observe line 116, and down loaded into the shift register 104. The down loaded data is then clocked out of the shift register 104 and supplied to dedicated diagnostics I/O pins (not shown) for user observability.

For diagnostics purposes, at times it may be desirable to initialize portions of the configuration logic or restore sampled data. The PLD of the present invention provides for a diagnostics load operation. The load operation performs essentially the reverse of the sample/observe operation discussed above. The data to be loaded is first shifted into the shift register 104 through the diagnostics I/O ports (not shown). SSUs 108 are then pre-loaded with the desired data via data lines 110 in response to a signal on the pre-load line 118. Upon a transition (e.g., rising edge) of the signal on the load line 114, the primary register 106 of a selected LAB 102 is then loaded with the data.

Thus, all logic element state information is sampled simultaneously, and clocked out over the course of several, for example, microseconds. Similarly, all logic element state information is set (or loaded) simultaneously, even though the data which is being injected is loaded into the device over the course of, for example, several microseconds. The use of SSUs 108 allow the sampling of the logic element register states while the system is still running in normal operation. That is, the user can observe the state of the logic element registers at any time during the normal operation of the system without disturbing the design functionality.

Figure 2:
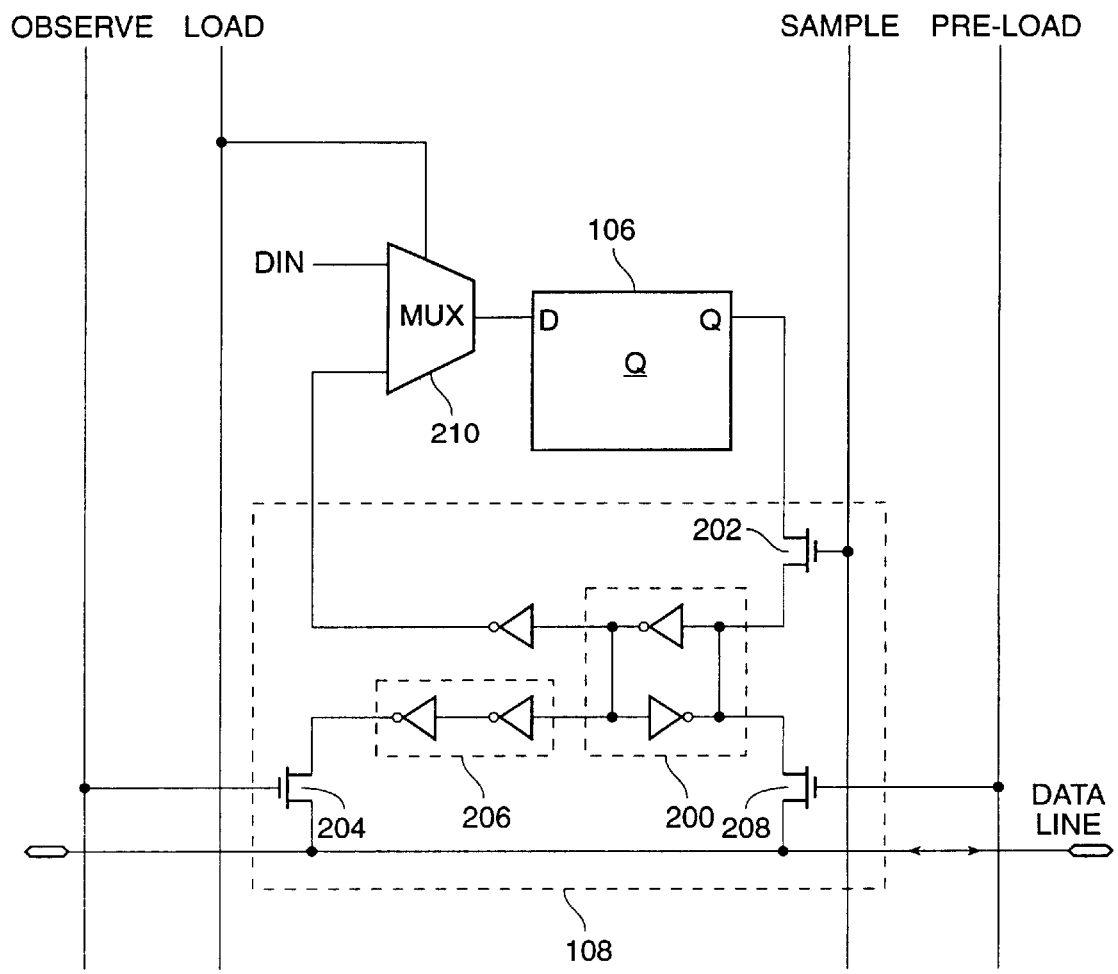
FIG. 2 is an exemplary partial circuit schematic for a logic element according to one embodiment of the present invention.

FIG. 2 is a partial circuit schematic for an exemplary logic element 100. SSU 108 includes a pair of cross-coupled inverters to form a static latch 200. When sampling the contents of the primary register 106, a signal on the sample line turns on pass transistor 202. This feeds the output of register 106 to the input of latch 200. Next, the observe line is asserted causing pass transistor 204 to couple the latched data to the bidirectional data line via a buffer 206.

When loading data into the logic element, the pre-load line is asserted causing pass transistor 208 to couple the data on the bidirectional data line to the input of latch 200. A multiplexer (MUX) 210 receives the output of latch 200 and a data-in (Din) line at its inputs. In normal programming mode, MUX 210 connects the Din line to the input of the register 106. When performing a diagnostic load operation into the logic element, the load signal is asserted causing MUX 210 to couple the output of latch 200 to the input of register 106. Data is preferably loaded into the slave latch of the master/slave register 106.

Figure 3:
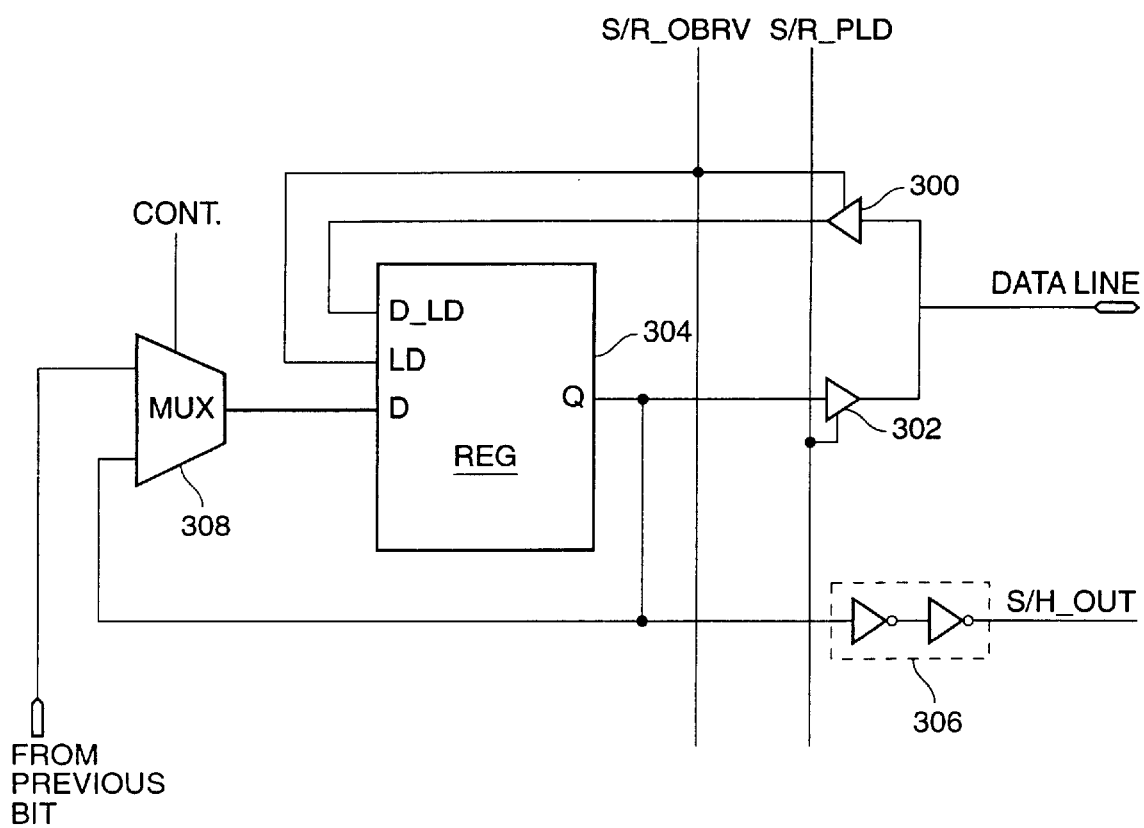
FIG. 3 is an exemplary schematic of a single bit inside the shift register.

FIG. 3 is a circuit schematic of an exemplary bit of the shift register 104. The bidirectional data line couples to an input and an output of tri-state drivers 300 and 302, respectively. Tri-state driver 300 drives the data load D_LD input of a register 304, and is enabled by a shift register observe S/R_OBSRV signal. The S/R_OBSRV signal also connects to register 304. Tri-state driver 302 connects to the output of register 304, drives the bidirectional data line, and is enabled by a shift register pre-load S/R_PLD signal. The output of register 304 is provided on a separate output line S/R_OUT via a buffer 306. A MUX 308 connects either the output of register 304 or the output from the preceding bit in the shift register to the D input of register 304. The feedback path through MUX 308 allows the register to hold the data.

Figure 4:
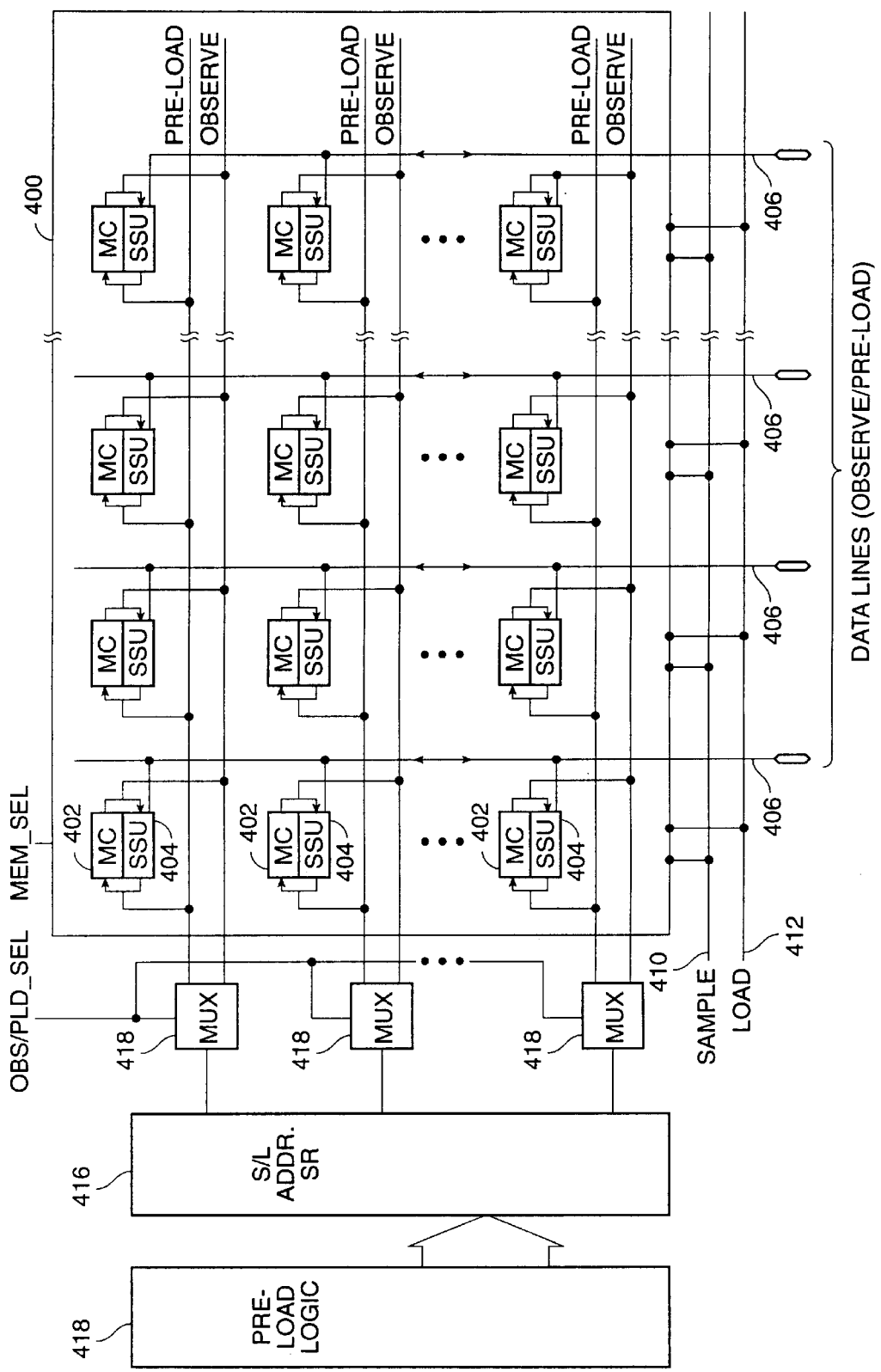
FIG. 4 shows a simplified block diagram of a memory block within the PLD with observable memory cells.

Certain types of PLDs may include blocks of memory for specialized applications. Such a PLD with an array of LABs may typically include separate blocks of memory, one for each row of LABs. For diagnostics purposes, it would also be desirable to be able to observe the contents of the memory blocks. FIG. 4 is a simplified block diagram for a PLD memory block with observable memory cell contents. The general approach is similar to the logic element observability scheme. Memory block 400 includes an array of memory cells (MCs), for example, static random access memory (SRAM) cells 402. Each MC 402 is provided with, and coupled to, a shadow storage unit (SSU) 404. Bidirectional data lines 406 carry the data that is being observed or being loaded into the memory cells 402. Memory block 400 shares the same data shift register 104 (FIG. 1, not shown here) that is provided for the given row of LABs. A separate sample line 410 and load line 412 provide the signals that activate the sampling and the loading operations for the memory block.

A separate address shift register 416 performs address decoding for row-wide sample and load operations. A logic "1" is shifted through shift register 416 to select the various rows of the memory block 400. A pre-load logic block 418 connects to shift register 416 to facilitate random selection of a row of memory. A multiplexer MUX 418 is provided for each row of memory to connect an output of shift register 416 to one of either the pre-load or the observe lines for each row of memory. MUX 418 is controlled by an OBS/PLD_SEL signal. In this example, therefore, the contents of the memory cells are observable and controllable on a row-wide basis. A memory select line 408 selects each memory block 400.

Figure 5:
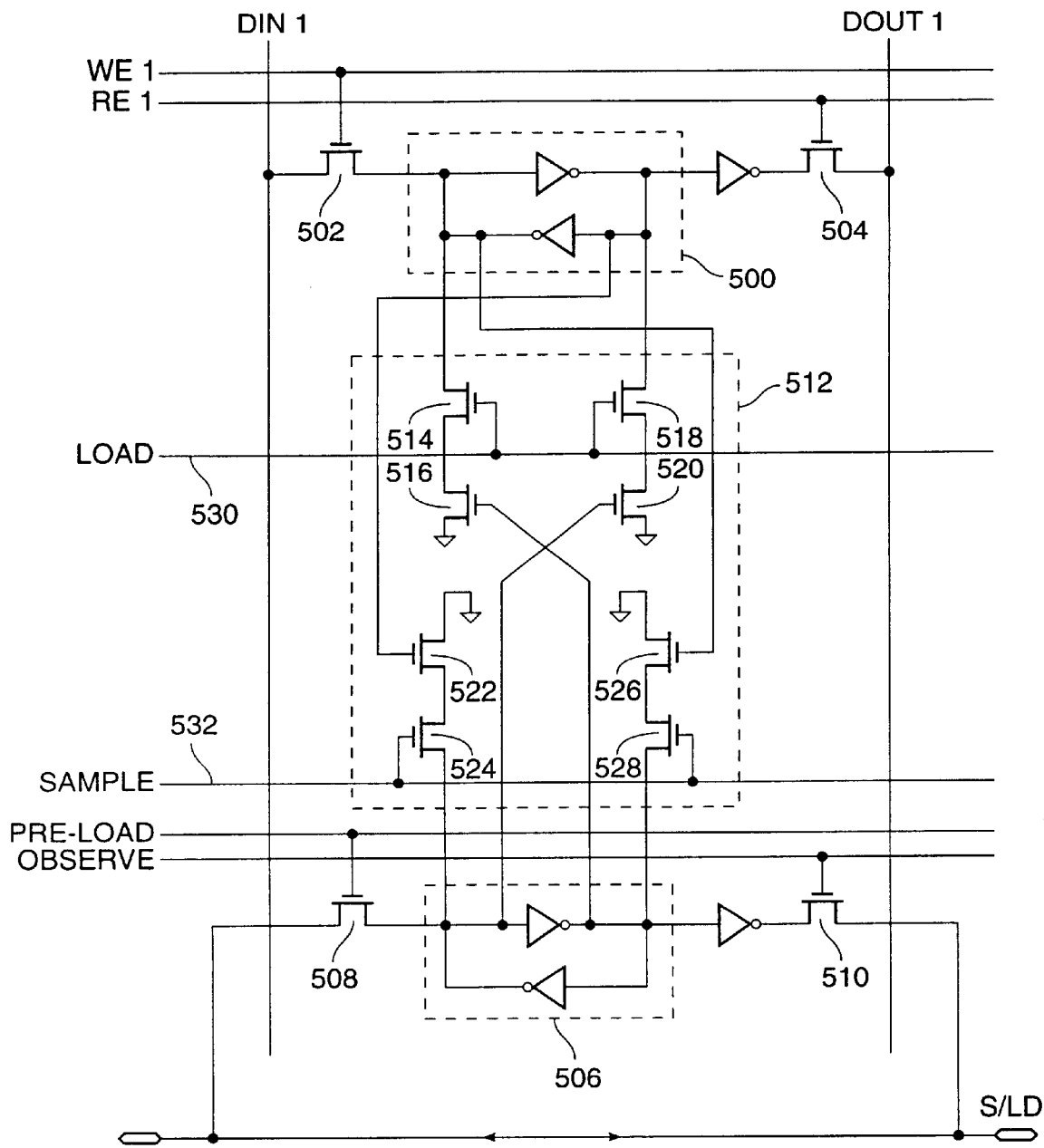
FIG. 5 is an exemplary schematic for a static random access memory cell coupled to a shadow storage unit.

FIG. 5 is one example of a circuit schematic for a memory cell that provides for observability and controllability according to this invention. A primary memory cell 500 includes a pair of cross-coupled inverters to form a static memory cell. Pass transistors 502 and 504 connect primary memory cell 500 to internal data lines DIN1 and DOUT1, respectively. Transistors 502 and 504 provide access to the cell for writing and reading the cell contents, respectively. A shadow latch 506 with access transistors 508 and 510 couples to a bidirectional sample/load global data line S/LD. In this example, a global data line S/LD separate from internal memory data lines DIN1 and DOUT1 are provided for the observe/control mode. Also, an alternative embodiment may provide separate input (control) and output (observe) data lines instead of a single bidirectional data line.

Shadow latch 506 couples to primary memory cell 500 by a data transfer circuit 512. Data transfer circuit is made up of transistors 514, 516, 518, 520, and 522, 524, 526, 528, that couple the storage nodes inside shadow latch 506 to the storage nodes inside primary memory cell 500. Transistors 514 and 518 receive the load signal on a load line 530 at their gate terminals, and transistors 524 and 528 receive the sample signal in a sample line 532 at their gate terminals. When the load signal is asserted, data transfer circuit 512 causes the contents of shadow latch 506 to be loaded into primary memory cell 500. When the sample signal is asserted, data transfer circuit 512 causes the contents of primary memory cell 500 to be transferred to shadow latch 506.

Figure 6:
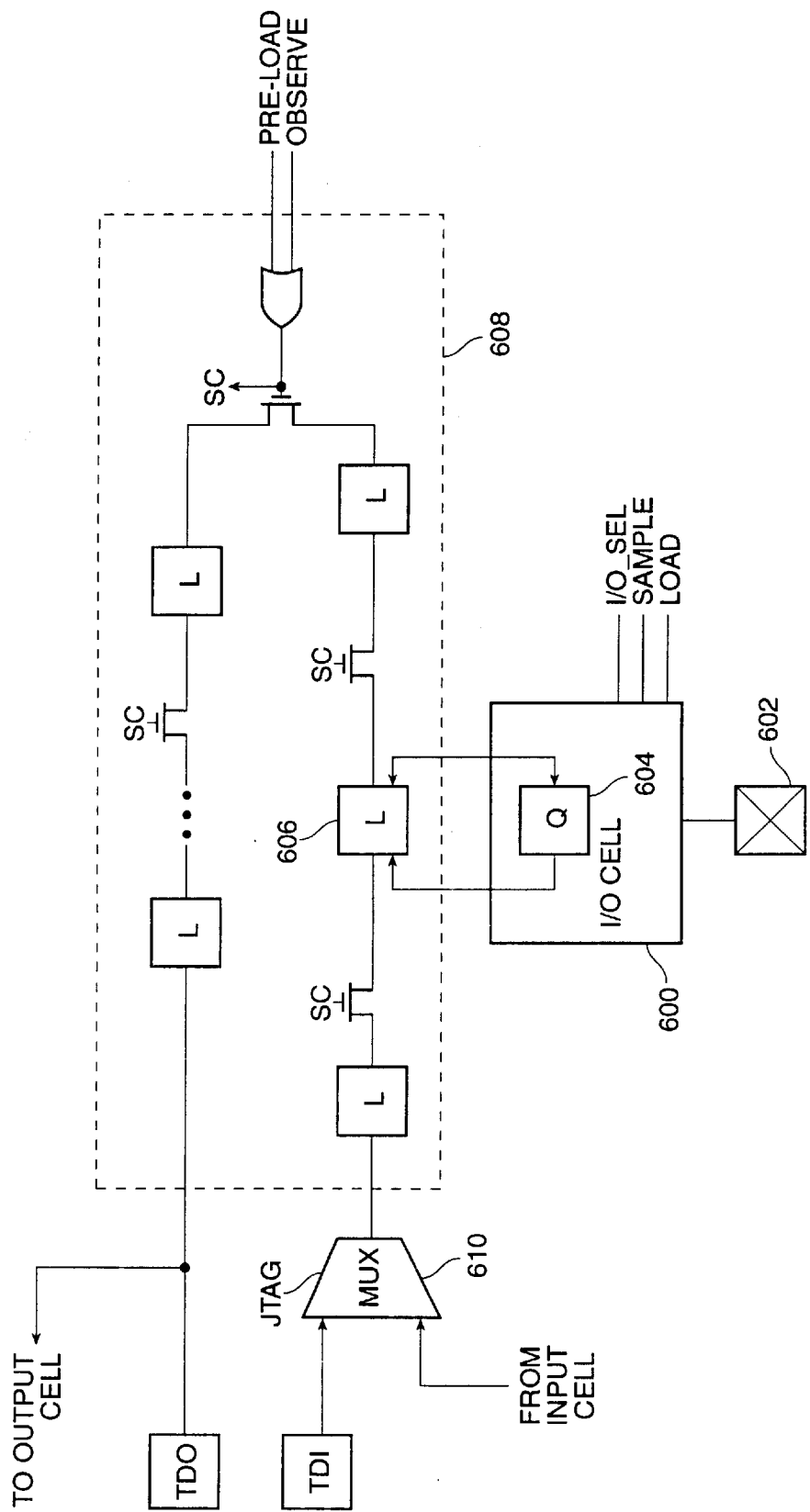
FIG. 6 shows a simplified diagram of an observable I/O cell in a PLD according to one embodiment of the present invention.

Registers inside I/O cells are another group of internal nodes in a PLD that are typically inaccessible to the user for diagnostics purposes. The present invention provides for a similar observability and controllability technique for the state of registers inside I/O cells. FIG. 6 is a simplified diagram showing an I/O cell with an internal register whose state is observable and controllable by the user. An I/O cell 600 is shown including a register Q 604. I/O cell 600 connects to an I/O pin 602. A shadow latch L 606 is coupled to register Q 604. I/O cell 600 receives signal lines I/O_ SEL, sample, and load that operate in a similar fashion as described in connection with the logic elements and memory blocks.

FIG. 6 shows shadow latch L 606 outside the boundaries of I/O cell 600 and as part of a chain of latches 608. Many PLDs support the JTAG standard and are thus already equipped with a chain of boundary scan latches. One embodiment of this invention uses the JTAG boundary scan latches to act as shadow latches for observability and controllability of I/O registers. A multiplexer 610 is provided to connect one of the TDI (test data in) or an input cell to the chain of latches depending on the mode of operation. Observe line 116 and pre-load line 118 are logically ORed together to generate a single serial chain control signal. The serial chain control signal turns on pass transistors 612 that link the chain of latches 606 together. Thus, the assertion of either one of the two signals (observe or pre-load) connects the chain of latches 606 together to facilitate the sample or load operations. This arrangement also allows the JTAG shift register to be used in the diagnostics mode.

Thus, the present invention offers the circuitry and methodology to provide the user with access to internal nodes buried inside a PLD. When the PLDs according to the present invention are used in prototyping or emulation systems, the observability and controllability allow the user to more effectively debug and troubleshoot the emulated design. While the above provides a complete description of various embodiments of the present invention, it is possible to use various alternatives, modifications and equivalents. For example, complete observability can be made available by type of circuit block. That is, the circuit can be designed with decoding logic to make only sub-blocks from the LABs observable. Similarly, the PLD can provide access to only selected memory blocks or selected logic elements at any given time. Thus the PLD can provide a variety of sampling options to the user.

Other embodiments of this invention may provide redundancy circuitry with built-in shadow latches for observability and controllability. For example, the PLD may include a redundant column of LABs that is identical in structure to the column of LABs shown in FIG. 1. Thus, in case of a defective LAB, a redundant column of LABs is switched in place of the column of LAB with the defective LAB, maintaining complete observability and controllability. Therefore, the scope of this invention should be determined not with reference to the above description, but should instead be determined by reference to the appended claims along with their full scope of equivalents.

What is claimed is:

1. In a programmable logic device (PLD), an input/output (I/O) architecture comprising:
   a plurality of I/O cells disposed along a periphery of the PLD and coupled to respective I/O terminals, each I/O cell having an I/O register; and
   a plurality of shadow I/O storage units corresponding, and respectively coupled, to said plurality of I/O registers,
   wherein, in an observable mode, data is selectively sampled from an I/O register in an I/O cell into a respective shadow I/O storage unit, and made available on an I/O terminal.

2. The I/O architecture of claim 1 wherein said plurality of shadow I/O storage units form a serial chain between a PLD input terminal and a PLD output terminal when coupled together via a corresponding plurality of pass transistors, a control terminal of said plurality of pass transistors being coupled to a logic OR combination of a pre-load and observe control signals.

3. The I/O architecture of claim 2 wherein said plurality of shadow I/O storage units are a plurality of registers used for JTAG boundary scan testing.

4. A programmable logic device (PLD) with observable and controllable internal nodes, said PLD comprising:
   a plurality of logic elements coupled by an interconnect network, each logic element comprising a primary register coupled to a shadow storage unit;
   a memory array having a plurality of primary memory cells respectively coupled to a corresponding plurality of shadow storage units; and
   a plurality of input/output (I/O) cells respectively coupled to a corresponding plurality of I/O terminals, each I/O cell comprising a primary I/O register coupled to a shadow storage unit,
   wherein, in an observe mode of operation, data is selectively sampled from said primary register, primary memory cell and primary I/O register into their respective shadow storage units and made available on PLD I/O terminal, and
   wherein, in a load mode of operation, data is selectively loaded from shadow storage units into respective primary register, memory cell and I/O register.

5. A method for observing and controlling the logic state of internal nodes of a probable logic device (PLD), said method comprising the steps of:
   A. providing a shadow storage unit for each internal node whose logic state is to be observed and controlled;
   B. coupling said shadow storage unit to its respective internal node by a selective coupling circuit;
   C. providing a data path from PLD input/output terminals to said shadow storage unit; and
   D. observing a logic state of an internal node by:
      i. transferring a logic state of said internal node into its respective shadow storage unit in a sample mode, and
      ii. transferring said logic state from said shadow storage unit to a PLD I/O terminal via said data path in an observe mode.

6. The method of claim 5 further comprising the steps of:
   F. controlling a logic state of an internal node by:
      i. pre-loading external data from a PLD I/O terminal into a shadow storage unit coupled to said internal node in a pre-load mode; and
      ii. applying said external data to said internal node in a load mode.

* * * * *